(12) United States Patent
Lee

(10) Patent No.: US 10,324,137 B2
(45) Date of Patent: Jun. 18, 2019

(54) INTELLIGENT METHOD FOR CALIBRATING BATTERY CAPACITY

(71) Applicant: Quanta Computer Inc., Taoyuan (TW)

(72) Inventor: Wen-Kai Lee, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 699 days.

(21) Appl. No.: 14/630,348

(22) Filed: Feb. 24, 2015

(65) Prior Publication Data

US 2016/0245873 A1    Aug. 25, 2016

(51) Int. Cl.

| G01R 31/36 | (2019.01) |
|---|---|
| G01R 31/367 | (2019.01) |
| G06F 11/30 | (2006.01) |
| G06F 11/32 | (2006.01) |
| G01R 31/392 | (2019.01) |

(52) U.S. Cl.
CPC ........ *G01R 31/367* (2019.01); *G06F 11/3003* (2013.01); *G06F 11/3058* (2013.01); *G06F 11/327* (2013.01); *G01R 31/392* (2019.01); *G06F 2201/81* (2013.01)

(58) Field of Classification Search
CPC ............ G01R 31/3648; G01R 31/3651; G01R 31/3679; G01R 31/3624; G06F 11/3006; G06F 11/3062
USPC .......................................................... 702/63
See application file for complete search history.

(56) References Cited

U.S. PATENT DOCUMENTS

| 7,072,871 | B1* | 7/2006 | Tinnemeyer | G01R 31/3651 320/132 |
|---|---|---|---|---|
| 8,855,954 | B1* | 10/2014 | Bickford | G07C 3/08 702/63 |
| 9,041,530 | B2* | 5/2015 | Sprigg | G08B 21/0453 340/539.12 |
| 9,197,079 | B2* | 11/2015 | Yip | H02J 7/0014 |
| 9,229,704 | B2* | 1/2016 | Throop | G06F 8/65 |
| 9,337,668 | B2* | 5/2016 | Yip | H02J 7/0004 |
| 2015/0277890 | A1* | 10/2015 | Throop | G06F 8/65 717/172 |
| 2016/0254682 | A1* | 9/2016 | Yip | H02J 7/0014 |
| 2016/0327614 | A1* | 11/2016 | Young | G01R 31/3679 |

* cited by examiner

*Primary Examiner* — Gene N Auduong
(74) *Attorney, Agent, or Firm* — Nixon Peabody LLP; Zhou Lu

(57) ABSTRACT

Various embodiments of the present technology provide methods for calibrating a full-charge capacity of a battery system. In some implementations, the battery system can be caused to enter into a static learning mode. During the static learning mode, current and past battery cell characteristics for each battery cell of the battery system can be collected, analyzed, and used to build up or update a database of correlations between a full-charge capacity of a specific type of battery cell and cell characteristics of a corresponding type of battery cell. The full-charge capacity of the battery system can be determined based at least upon cell characteristics of battery cells of the battery system, or the database of correlations between a full-charge capacity of a specific type of battery cell and cell characteristics of battery cells in the battery system.

20 Claims, 5 Drawing Sheets

INTELLIGENT METHOD FOR CALIBRATING BATTERY CAPACITY

TECHNICAL FIELD

The present technology relates generally to server systems in a telecommunications network.

BACKGROUND

Modern server farms or datacenters typically employ a large number of servers to handle processing needs for a variety of application services. Each server handles various operations and requires a certain level of power consumption to maintain these operations. Some of these operations are "mission critical" operations, interruptions to which may lead to significant security breach or revenue losses for users associated with these operations.

However, interruptions of an AC power to datacenters can be unpredictable. In some cases, power interruptions can force a sudden shutdown and/or possibly resulting in data losses. Datacenters typically have back-up powers (e.g., energy stored in batteries) to support power consumption during AC power interruptions. The sudden shutdown can be prevented if a datacenter maintains a certain level of backup power before an input power interruption occurs. But exact capacity of a battery system can be affected by many factors, such as nature of battery chemistry, or degradation of battery cells over time. It can be very difficult to predict an amount of charge stored in the battery system after recharging.

SUMMARY

Systems and methods in accordance with various embodiments of the present technology provide a solution to the above-mentioned problems by intelligently calibrating a battery system of a server system such that a full-charge capacity of the battery system can be determined in substantially real time, and, in response to the full-charge capacity being below a threshold battery capacity, generating a battery-aging alarm signal. More specifically, various embodiments of the present technology provide methods for determining a full-charge capacity of a battery system by periodically calibrating the battery system based at least upon a status or ambient temperature of the battery system. The status of the battery system can include, but is not limited to, past and current battery cell characteristics, such as age, temperature, resistance, output voltage, and/or charging and discharging cycles, of each battery cell of the battery system. According to a determined full-charge capacity of the battery system, various implementations enable a server system to maintain a suitable battery capacity to support power consumption of the server system during an input power interruption. The suitable battery capacity can enable the server system to have enough time to be switched to an alternative input power or safely shut down to avoid possible data losses.

Some implementations can cause a battery system to enter into a static learning mode if a predetermined period of time has lapsed since a previous determination of a full-charge capacity of the battery system. During the static learning mode, current and past battery cell characteristics for each battery cell of the battery system can be collected, analyzed, and used to build up or update a database of correlations between a full-charge capacity of a specific type of battery cell and cell characteristics of a corresponding type of battery cell. The full-charge capacity of the battery system can be determined based at least upon cell characteristics of battery cells of the battery system or the database of correlations between a full-charge capacity of a specific type of battery cell and cell characteristics of battery cells in the battery system.

In some implementations, in response to receiving a learning mode command and a predetermined period of time having lapsed since a previous determination of a full-charge capacity of the battery system, the battery system can be switched to a constant current mode, which causes the battery system to be discharged with a constant current. After a predetermined percentage of a previously determined full-charge capacity having been discharged, the battery system can be recharged back to its full-charge capacity. An updated full-charge capacity of the battery system can be determined based at least upon cell characteristics of each battery cell of the battery system during discharging and recharging periods.

In some implementations, in response to receiving a battery discharge command, a battery system can enter into a fully charging and discharging mode. The battery can be fully discharged and then recharged to its full-charge capacity. A full-charge capacity of the battery system can be determined based at least upon currents flowing out and into the battery system during charging and discharging periods or cell characteristics (e.g., charging and discharging cycles, age and temperature) of each battery cell of the battery system.

BRIEF DESCRIPTION OF THE DRAWINGS

In order to describe the manner in which the above-recited and other advantages and features of the disclosure can be obtained, a more particular description of the principles briefly described above will be rendered by reference to specific examples thereof which are illustrated in the appended drawings. Understanding that these drawings depict only example aspects of the disclosure and are not therefore to be considered to be limiting of its scope, the principles herein are described and explained with additional specificity and detail through the use of the accompanying drawings in which.

DETAILED DESCRIPTION

Various embodiments of the present technology provide methods for calibrating a full-charge capacity of a battery system in a server system. In some implementations, the battery system can be caused to enter into a static learning mode. During the static learning mode, current and past battery cell characteristics for each battery cell of the battery system can be collected, analyzed, and used to build up a database of correlations between a full-charge capacity of a specific type of battery cell and cell characteristics of a corresponding type of battery cell. The full-charge capacity of the battery system can be determined based at least upon the database of correlations between a full-charge capacity of a specific type of battery cell and cell characteristics of battery cells in the battery system.

Figure 1:
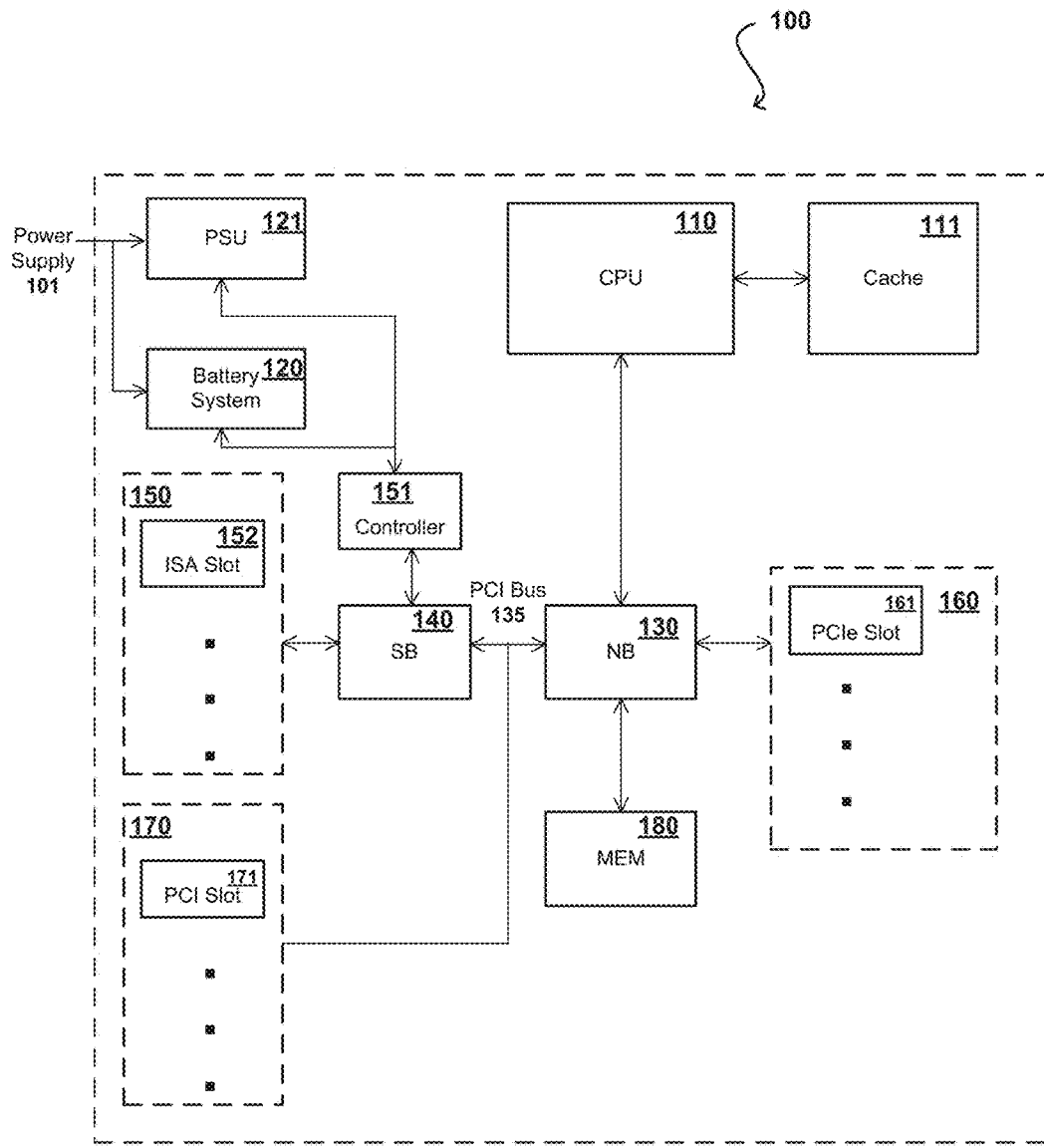
FIG. 1 illustrates a schematic block diagram of an exemplary server system in accordance with an implementation of the present technology.

FIG. 1 illustrates a schematic block diagram of an exemplary server system 100 in accordance with an implementation of the present technology. In this example, the server system 100 comprises at least one microprocessor or CPU 110 connected to a cache 111, a main memory 180, at least one power supply unit (PSU) 121, and a battery system 120 that is parallel with the PSU 121. The main memory 180 can be coupled to the CPU 110 via a north bridge (NB) logic 130. A memory control module (not shown) can be used to control operations of the main memory 180 by asserting necessary control signals during memory operations. The main memory 180 may include, but is not limited to, dynamic random access memory (DRAM), double data rate DRAM (DDR DRAM), static RAM (SRAM), or other types of suitable memory.

In some implementations, the CPU 110 can be multi-core processors, each of which is coupled together through a CPU bus connected to the NB logic 130. In some implementations, the NB logic 130 can be integrated into the CPU 110. The NB logic 130 can also be connected to a plurality of peripheral component interconnect express (PCIe) ports 160 and a south bridge (SB) logic 140. The plurality of PCIe ports 160 can be used for connections and buses such as PCI Express x1, USB 2.0, SMBus, SIM card, future extension for another PCIe lane, 1.5 V and 3.3 V power, and wires to diagnostics LEDs on the server's chassis.

In this example, the NB logic 130 and the SB logic 140 are connected by a peripheral component interconnect (PCI) Bus 135. The PCI Bus 135 can support function on the CPU 110 but in a standardized format that is independent of any of CPU's native buses. The PCI Bus 135 can be further connected to a plurality of PCI slots 170 (e.g., a PCI slot 171). Devices connect to the PCI Bus 135 may appear to a bus controller (not shown) to be connected directly to a CPU bus, assigned addresses in the CPU 110's address space, and synchronized to a single bus clock. PCI cards can be used in the plurality of PCI slots 170 include, but are not limited to, network interface cards (NICs), sound cards, modems, TV tuner cards, disk controllers, video cards, small computer system interface (SCSI) adapters, and personal computer memory card international association (PCMCIA) cards.

The SB logic 140 can couple the PCI bus 135 to a plurality of expansion cards or slots 150 (e.g., an ISA slot 152) via an expansion bus. The expansion bus can be a bus used for communications between the SB logic 140 and peripheral devices, and may include, but is not limited to, an industry standard architecture (ISA) bus, PC/104 bus, low pin count bus, extended ISA (EISA) bus, universal serial bus (USB), integrated drive electronics (IDE) bus, or any other suitable bus that can be used for data communications for peripheral devices.

In the example, the SB logic 140 is further coupled to a controller 151 that is connected to the battery system 120. The battery system 120 is connected to the one or more PSU 121. The PSU 121 is configured to supply powers to various component of the server system 100, such as the CPU 110, cache 111, NB logic 130, PCIe slots 160, main memory 180, SB logic 140, ISA slots 150, PCI slots 170, and controller 151. After being powered on, the server system 100 is configured to load software application from memory, computer storage device, or an external storage device to perform various operations.

The battery system 120 is configured to supply power to the server system 100 when the power supply 101 is interrupted. The battery system 120 can include one or more rechargeable battery cells. The one or more rechargeable battery cells may include, but are not limited to, an electrochemical cell, fuel cell, or ultra-capacitor. The electrochemical cell may include one or more chemicals from a list of lead-acid, nickel cadmium (NiCd), nickel metal hydride (NiMH), lithium ion (Li-ion), and lithium ion polymer (Li-ion polymer). In a charging mode, the one or more rechargeable battery cells can be charged by the PSU 121. In a discharging mode, the one or more rechargeable battery cells can supply currents to other components of the server system 100.

In some implementations, the controller 151 can be a baseboard management controller (BMC), rack management controller (RMC), a keyboard controller, or any other suitable type of system controller. The controller 151 is configured to control operations of the battery system 120 and/or other applicable operations.

Some implementations enable the controller 151 to monitor operating characteristics of each battery cell and operation modes of the battery system 120. For example, the controller 151 can monitor an output voltage of the battery system 120 or each battery cell of the battery system 120, temperature and DC resistance of each battery cell, output voltage and DC resistance of each battery cell, charging and recharging history, and/or environment temperature. In some implementations, the controller 151 can comprise a plurality of function modules, each of which monitors a specific characteristic and its associated history of battery cells in the battery system 120.

Some implementations enable the controller 151 to collect and analyze current and past battery cell characteristics, such as cell age, cell temperature, environment temperature, cell resistance, output voltage, and/or charging and discharging cycles, for a specific type of battery cell in the battery system 120. In some implementations, for a specific type of battery cell, a database of correlations between a full-charge capacity and cell characteristics can be dynamically built based upon actual charge capacities of the specific type battery cells and their corresponding cell characteristics and history. By analyzing current and past battery cell characteristics of each battery cell in the battery system 120 and comparing analyzed data with the database of correlations, the controller 151 can estimate a full-charge capacity of each battery cell in the battery system 120 based upon the database of correlations, and thus determine a full-charge capacity of the battery system 120.

Figure 5:
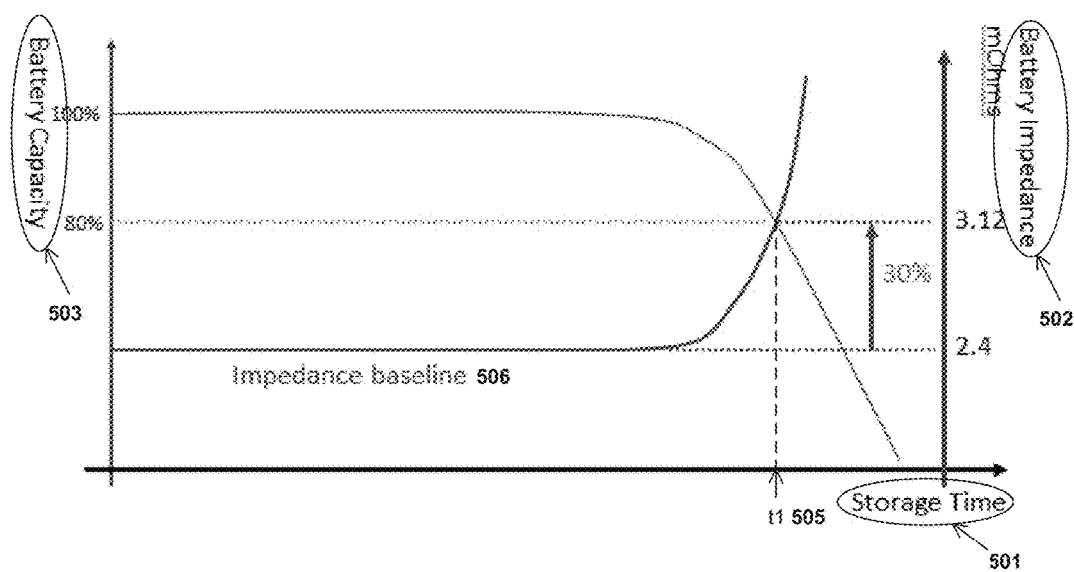
FIG. 5 illustrates an example correlation of a full-charge capacity and battery impedance of a specific type of battery cell versus storage time in accordance with various embodiments of the present technology.

FIG. 5 illustrates an example correlation of a full-charge battery capacity and battery impedance of a specific type of battery cell versus storage time in accordance with various embodiments of the present technology. In this example, a full-charge capacity 503 and battery internal impedance 502 of the specific type of battery cell change over a storage time 501. At t1 505, the full-charge capacity 503 degrades to 80 percentage of a full-charge capacity of a new battery cell while the internal impedance 502 increases 30 percentage from an impedance baseline 506 of the specific type of battery cell. For the specific type of battery, a full-charge capacity of a particular cell can be determined by measuring the internal impedance of the corresponding cell.

In some implementations, a database of correlations between a full-charge capacity of a specific type of battery cell and cell characteristics of a corresponding type of battery cell can be updated during a power supply interruption. For example, in response to a power supply interruption, the controller 151 can monitor currents flowing out of each battery cell or the battery system 120 as a whole during a discharging period, and currents flowing into each battery cell or the battery system 120 during a recharging period. Cell characteristics of each battery cell of the battery system 120 can be automatically measured during the charging and recharging periods. The database of correlations between the full-charge capacity of a specific type of battery cell and its corresponding cell characteristics can be updated based upon corrections between actual charges flowing into and out of each battery cell or the battery system 120 and measured cell characteristics of each battery cell of the battery system 120.

In some implementations, different types of sensors built into the server system 100 can report parameters (e.g., temperature, cooling fan speeds, power status, and/or operating system (OS) status) to the controller 151. The controller 151 can then monitor these sensors on the server system 100 and can be configured to take appropriate action when necessary. For example, in response to any parameter on the sensors going beyond preset limits, which can indicate a potential failure of the server system 100, the controller 151 can be configured to perform a suitable operation in response to the potential failure. The suitable operation can include, but is not limited to, sending an alert to the CPU 110 or a system administrator over a network, or taking some corrective action such as resetting or power cycling the node to get a hung OS running again). For example, the controller 151 can send out an battery-aging-alarm signal when a determined full-charge capacity of the battery system 120 is below a threshold battery capacity.

Although only certain components are shown within the server system 100 in FIG. 1, various types of electronic or computing components that are capable of processing or storing data, or receiving or transmitting signals can also be included in server system 100. Further, the electronic or computing components in the server system 100 can be configured to execute various types of application and/or can use various types of operating systems. These operating systems can include, but are not limited to, Android, Berkeley Software Distribution (BSD), iPhone OS (iOS), Linux, OS X, Unix-like Real-time Operating System (e.g., QNX), Microsoft Windows, Window Phone, and IBM z/OS.

Depending on the desired implementation for the server system 100, a variety of networking and messaging protocols can be used, including but not limited to TCP/IP, open systems interconnection (OSI), file transfer protocol (FTP), universal plug and play (UpnP), network file system (NFS), common internet file system (CIFS), AppleTalk etc. As would be appreciated by those skilled in the art, the server system 100 illustrated in FIG. 1 is used for purposes of explanation. Therefore, a network system can be implemented with many variations, as appropriate, yet still provide a configuration of network platform in accordance with various embodiments of the present technology.

In exemplary configuration of FIG. 1, the server system 100 can also include one or more wireless components operable to communicate with one or more electronic devices within a computing range of the particular wireless channel. The wireless channel can be any appropriate channel used to enable devices to communicate wirelessly, such as Bluetooth, cellular, NFC, or Wi-Fi channels. It should be understood that the device can have one or more conventional wired communications connections, as known in the art. Various other elements and/or combinations are possible as well within the scope of various embodiments.

Figure 2:
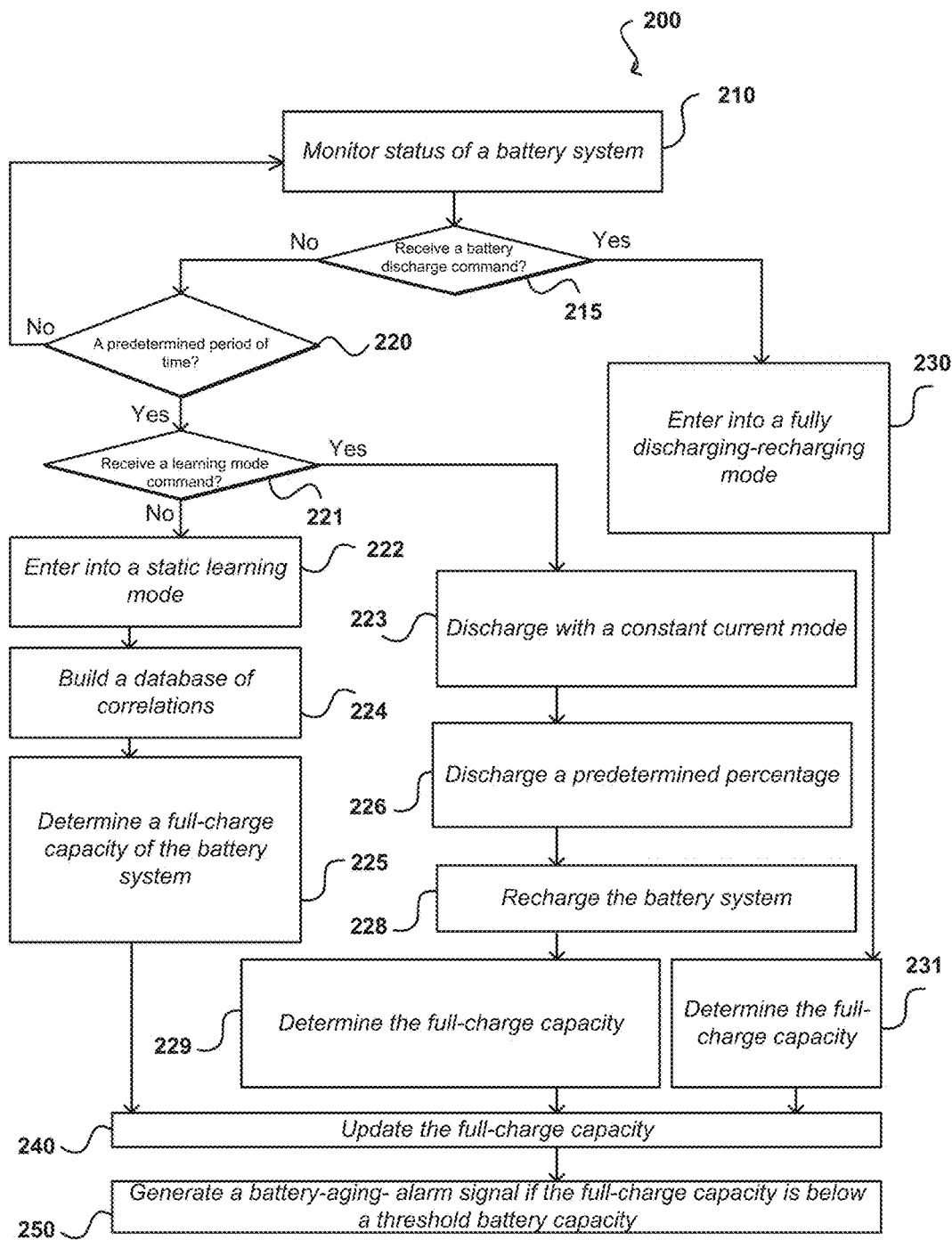
FIG. 2 illustrates an exemplary method of intelligently calibrating battery capacity of a battery system in accordance with an implementation of the present technology.

FIG. 2 illustrates an exemplary method of intelligently calibrating battery capacity of a battery system in accordance with an implementation of the present technology. It should be understood that the exemplary method 200 is presented solely for illustrative purposes and that in other methods in accordance with the present technology can include additional, fewer, or alternative steps performed in similar or alternative orders, or in parallel.

The exemplary method 200 starts with monitoring a status of a battery system, at step 210. The status of the battery system can include operating characteristics of each battery cell and operation modes of the battery system. In some implementations, a database of correlations between a full-charge capacity of a specific type of battery cell and cell characteristics of a corresponding type of battery cell can be dynamically built and updated based upon actual full-charge capacities of battery cells of the specific type and their corresponding cell characteristics and history.

At step 215, a determination can be made whether a battery discharge command is received. If no battery discharge command is received, a determination can be made whether a predetermined period (e.g., 30 days) of time has lapsed since a full-charge capacity of the battery system was previously updated, at step 220. If the predetermined period of time has lapsed, a determination can be made whether a learning mode command is received, at step 221.

If the predetermined period of time has lapsed and neither the battery discharge command nor the learning mode command has been received, the battery system can be caused to enter into a static learning mode, at step 222. During the static learning mode, current and past battery cell characteristics of each battery cell of the battery system can be collected, analyzed and used to build up or update a database of correlations between a full-charge capacity of a specific type of battery cell and cell characteristics of a corresponding type of battery cell, at step 224. The full-charge capacity of the battery system can be determined based at least upon cell characteristics of at least one battery cell of the battery system, ambient temperature, or the database of correlations between a full-charge capacity of a specific type of battery cell and cell characteristics of battery cells in the battery system, at step 225. The battery cell characteristics can include, but are not limited to cell age, output voltage, cell temperature, environment temperature, cell resistance, and/or charging and discharging cycles.

If the predetermined period of time has lapsed and the learning mode command has been received, the battery system can be switched to a constant current mode, at step 223. The constant current mode can cause the battery system to be discharged with a constant current. A predetermined percentage (e.g., 20%) of a previously determined full-charge capacity of the battery can be discharged, at step 226. For example, a controller can monitor a current flowing out of the battery system and stop the discharging process when the predetermined percentage of the previously determined full-charge capacity has been discharged. At step 228, the battery system can be recharged to its full-charge capacity. An updated full-charge capacity of the battery system can be determined based at least upon cell characteristics of each battery cell of the battery system during discharging and recharging periods, at step 229.

If the battery discharge command is received, the battery system can enter into a fully discharging-recharging mode, at step 230. During the fully discharging-recharging mode, the battery system is first fully discharged and subsequently recharged to its full-charge capacity. Currents flowing out and into the battery system can be monitored and used to determine the full-charge capacity of the battery system, at step 231.

At step 240, the full-charge capacity of the battery system can be updated based upon determined full-charge capacity in the static learning mode, the constant current mode, or the fully discharging-recharging mode. If the updated full-charge capacity of the battery system is below a threshold battery capacity, a battery-aging-alarm signal can be generated, at step 250. In some implementations, the battery-aging-alarm signal can include the status of each battery cell of the battery system or an identification of battery cell that needs to be replaced.

Terminologies

A computer network is a geographically distributed collection of nodes interconnected by communication links and segments for transporting data between endpoints, such as personal computers and workstations. Many types of networks are available, with the types ranging from local area networks (LANs) and wide area networks (WANs) to overlay and software-defined networks, such as virtual extensible local area networks (VXLANs).

LANs typically connect nodes over dedicated private communications links located in the same general physical location, such as a building or campus. WANs, on the other hand, typically connect geographically dispersed nodes over long-distance communications links, such as common carrier telephone lines, optical lightpaths, synchronous optical networks (SONET), or synchronous digital hierarchy (SDH) links. LANs and WANs can include layer 2 (L2) and/or layer 3 (L3) networks and devices.

The Internet is an example of a WAN that connects disparate networks throughout the world, providing global communication between nodes on various networks. The nodes typically communicate over the network by exchanging discrete frames or packets of data according to predefined protocols, such as the Transmission Control Protocol/Internet Protocol (TCP/IP). In this context, a protocol can refer to a set of rules defining how the nodes interact with each other. Computer networks can be further interconnected by an intermediate network node, such as a router, to extend the effective "size" of each network.

Overlay networks generally allow virtual networks to be created and layered over a physical network infrastructure. Overlay network protocols, such as Virtual Extensible LAN (VXLAN), Network Virtualization using Generic Routing Encapsulation (NVGRE), Network Virtualization Overlays (NVO3), and Stateless Transport Tunneling (STT), provide a traffic encapsulation scheme which allows network traffic to be carried across L2 and L3 networks over a logical tunnel. Such logical tunnels can be originated and terminated through virtual tunnel end points (VTEPs).

Moreover, overlay networks can include virtual segments, such as VXLAN segments in a VXLAN overlay network, which can include virtual L2 and/or L3 overlay networks over which VMs communicate. The virtual segments can be identified through a virtual network identifier (VNI), such as a VXLAN network identifier, which can specifically identify an associated virtual segment or domain.

Network virtualization allows hardware and software resources to be combined in a virtual network. For example, network virtualization can allow multiple numbers of VMs to be attached to the physical network via respective virtual LANs (VLANs). The VMs can be grouped according to their respective VLAN, and can communicate with other VMs as well as other devices on the internal or external network.

Network segments, such as physical or virtual segments, networks, devices, ports, physical or logical links, and/or traffic in general can be grouped into a bridge or flood domain. A bridge domain or flood domain can represent a broadcast domain, such as an L2 broadcast domain. A bridge domain or flood domain can include a single subnet, but can also include multiple subnets. Moreover, a bridge domain can be associated with a bridge domain interface on a network device, such as a switch. A bridge domain interface can be a logical interface which supports traffic between an L2 bridged network and an L3 routed network. In addition, a bridge domain interface can support internet protocol (IP) termination, VPN termination, address resolution handling, MAC addressing, etc. Both bridge domains and bridge domain interfaces can be identified by a same index or identifier.

Furthermore, endpoint groups (EPGs) can be used in a network for mapping applications to the network. In particular, EPGs can use a grouping of application endpoints in a network to apply connectivity and policy to the group of applications. EPGs can act as a container for buckets or collections of applications, or application components, and tiers for implementing forwarding and policy logic. EPGs also allow separation of network policy, security, and forwarding from addressing by instead using logical application boundaries.

Cloud computing can also be provided in one or more networks to provide computing services using shared resources. Cloud computing can generally include Internet-based computing in which computing resources are dynamically provisioned and allocated to client or user computers or other devices on-demand, from a collection of resources available via the network (e.g., "the cloud"). Cloud computing resources, for example, can include any type of resource, such as computing, storage, and network devices, virtual machines (VMs), etc. For instance, resources can include service devices (firewalls, deep packet inspectors, traffic monitors, load balancers, etc.), compute/processing devices (servers, CPU's, memory, brute force processing capability), storage devices (e.g., network attached storages, storage area network devices), etc. In addition, such resources can be used to support virtual networks, virtual machines (VM), databases, applications (Apps), etc.

Cloud computing resources can include a "private cloud," a "public cloud," and/or a "hybrid cloud." A "hybrid cloud" can be a cloud infrastructure composed of two or more clouds that inter-operate or federate through technology. In essence, a hybrid cloud is an interaction between private and public clouds where a private cloud joins a public cloud and utilizes public cloud resources in a secure and scalable manner. Cloud computing resources can also be provisioned via virtual networks in an overlay network, such as a VXLAN.

Figure 3:
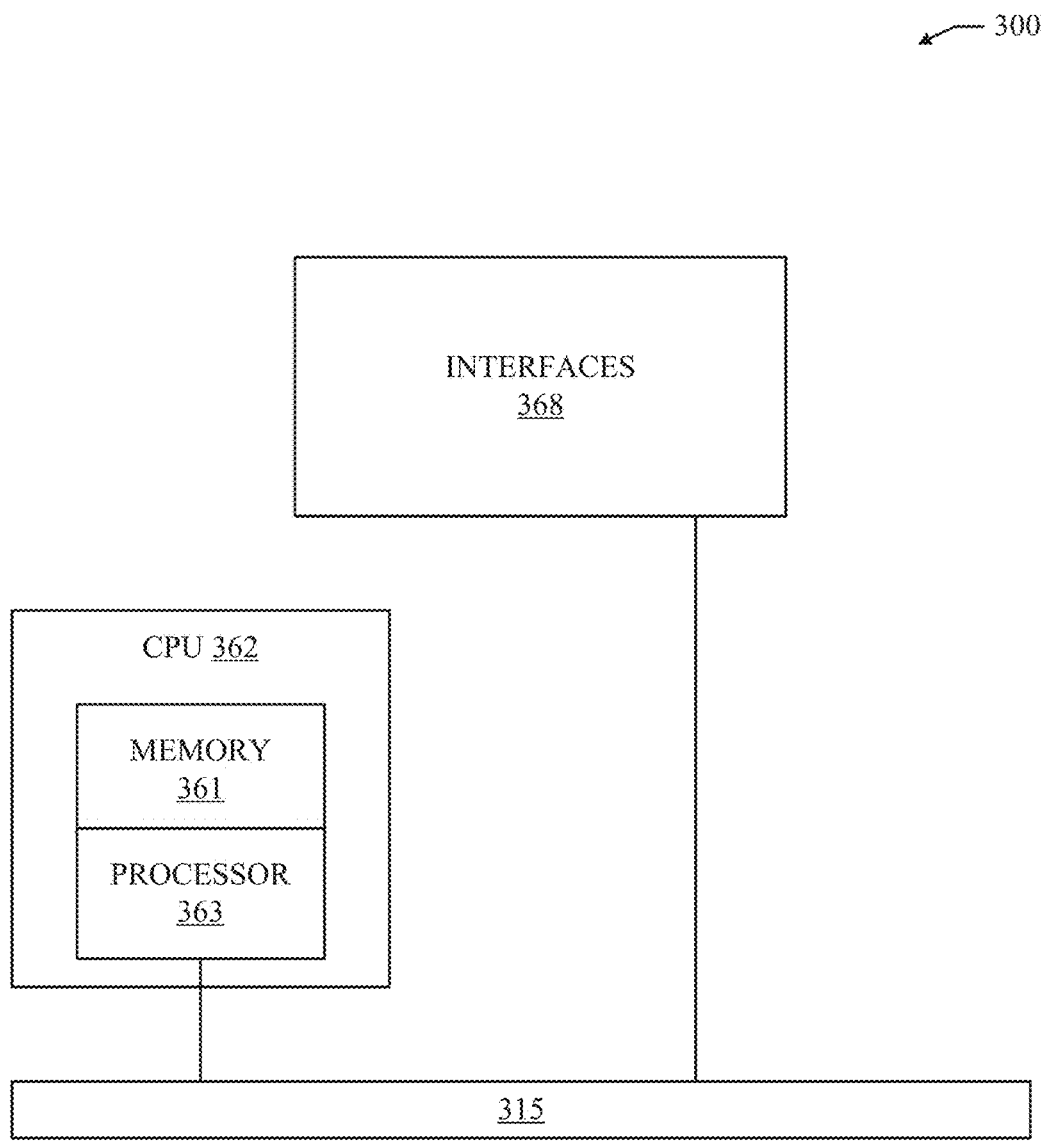
FIG. 3 illustrates an exemplary computing device in accordance with various implementations of the technology.

In a network switch system, a lookup database can be maintained to keep track of routes between a number of end points attached to the switch system. However, end points can have various configurations and are associated with numerous tenants. These end-points can have various types of identifiers, e.g., IPv4, IPv6, or Layer-2. The lookup database has to be configured in different modes to handle different types of end-point identifiers. Some capacity of the lookup database is carved out to deal with different address types of incoming packets. Further, the lookup database on the network switch system is typically limited by 1K virtual routing and forwarding (VRFs). Therefore, an improved lookup algorithm is desired to handle various types of end-point identifiers. The disclosed technology addresses the need in the art for address lookups in a telecommunications network. Disclosed are systems, methods, and computer-readable storage media for unifying various types of end-point identifiers by mapping end-point identifiers to a uniform space and allowing different forms of lookups to be uniformly handled. A brief introductory description of example systems and networks, as illustrated in FIGS. 3 and 4, is disclosed herein. These variations shall be described herein as the various examples are set forth. The technology now turns to FIG. 3.

FIG. 3 illustrates an example computing device 300 suitable for implementing the present technology. Computing device 300 includes a master central processing unit (CPU) 362, interfaces 368, and a bus 315 (e.g., a PCI bus). When acting under the control of appropriate software or firmware, the CPU 362 is responsible for executing packet management, error detection, and/or routing functions, such as miscabling detection functions, for example. The CPU 362 preferably accomplishes all these functions under the control of software including an operating system and any appropriate applications software. CPU 362 can include one or more processors 363 such as a processor from the Motorola family of microprocessors or the MIPS family of microprocessors. In an alternative embodiment, processor 363 is specially designed hardware for controlling the operations of the computing device 300. In a specific embodiment, a memory 361 (such as non-volatile RAM and/or ROM) also forms part of CPU 362. However, there are many different ways in which memory could be coupled to the system.

The interfaces 368 are typically provided as interface cards (sometimes referred to as "line cards"). Generally, they control the sending and receiving of data packets over the network and sometimes support other peripherals used with the computing device 300. Among the interfaces that can be provided are Ethernet interfaces, frame relay interfaces, cable interfaces, DSL interfaces, token ring interfaces, and the like. In addition, various very high-speed interfaces can be provided such as fast token ring interfaces, wireless interfaces, Ethernet interfaces, Gigabit Ethernet interfaces, ATM interfaces, HSSI interfaces, POS interfaces, FDDI interfaces and the like. Generally, these interfaces can include ports appropriate for communication with the appropriate media. In some cases, they can also include an independent processor and, in some instances, volatile RAM. The independent processors can control such communications intensive tasks as packet switching, media control and management. By providing separate processors for the communications intensive tasks, these interfaces allow the master microprocessor 362 to efficiently perform routing computations, network diagnostics, security functions, etc.

Although the system shown in FIG. 3 is one specific network device of the present invention, it is by no means the only network device architecture on which the present invention can be implemented. For example, an architecture having a single processor that handles communications as well as routing computations, etc. is often used. Further, other types of interfaces and media could also be used with the router.

Regardless of the network device's configuration, it can employ one or more memories or memory modules (including memory 361) configured to store program instructions for the general-purpose network operations and mechanisms for roaming, route optimization and routing functions described herein. The program instructions can control the operation of an operating system and/or one or more applications, for example. The memory or memories can also be configured to store tables such as mobility binding, registration, and association tables, etc.

Figure 4A:
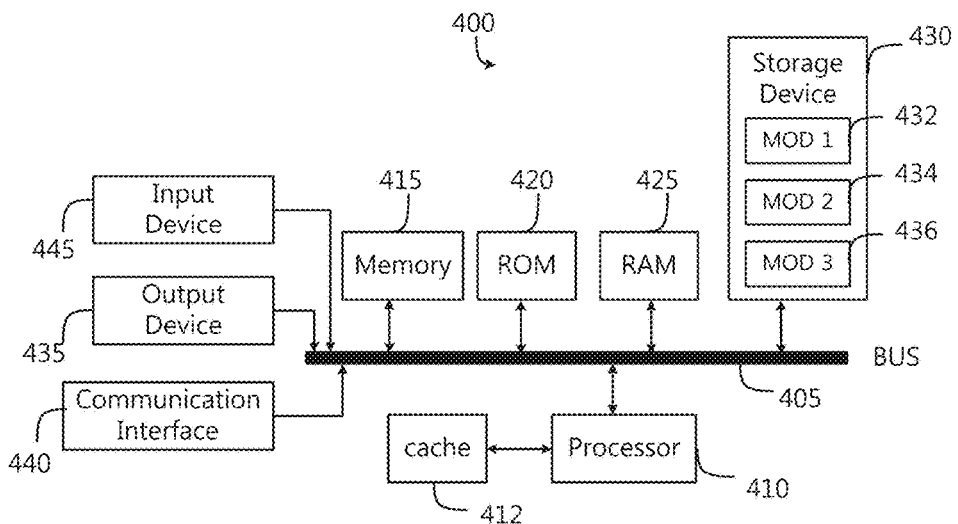
FIGS. 4A and 4B illustrate exemplary systems in accordance with various embodiments of the present technology.
Figure 4B:
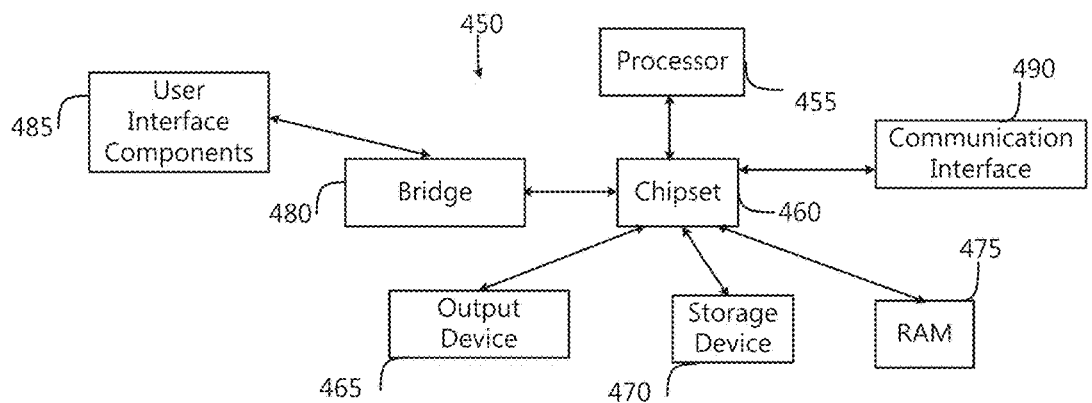

FIG. 4A, and FIG. 4B illustrate example possible systems in accordance with various aspects of the present technology. The more appropriate embodiment will be apparent to those of ordinary skill in the art when practicing the present technology. Persons of ordinary skill in the art will also readily appreciate that other system examples are possible.

FIG. 4A illustrates a conventional system bus computing system architecture 400 wherein the components of the system are in electrical communication with each other using a bus 405. Example system 400 includes a processing unit (CPU or processor) 410 and a system bus 405 that couples various system components including the system memory 415, such as read only memory (ROM) 420 and random access memory (RAM) 425, to the processor 410. The system 400 can include a cache of high-speed memory connected directly with, in close proximity to, or integrated as part of the processor 410. The system 400 can copy data from the memory 415 and/or the storage device 430 to the cache 412 for quick access by the processor 410. In this way, the cache can provide a performance boost that avoids processor 410 delays while waiting for data. These and other modules can control or be configured to control the processor 410 to perform various actions. Other system memory 415 can be available for use as well. The memory 415 can include multiple different types of memory with different performance characteristics. The processor 410 can include any general purpose processor and a hardware module or software module, such as module 432, module 434, and module 436 stored in storage device 430, configured to control the processor 410 as well as a special-purpose processor where software instructions are incorporated into the actual processor design. The processor 410 can essentially be a completely self-contained computing system, containing multiple cores or processors, a bus, memory controller, cache, etc. A multi-core processor can be symmetric or asymmetric.

To enable user interaction with the computing device 400, an input device 445 can represent any number of input mechanisms, such as a microphone for speech, a touch-sensitive screen for gesture or graphical input, keyboard, mouse, motion input, speech and so forth. An output device 435 can also be one or more of a number of output mechanisms known to those of skill in the art. In some instances, multimodal systems can enable a user to provide multiple types of input to communicate with the computing device 400. The communications interface 440 can generally govern and manage the user input and system output. There is no restriction on operating on any particular hardware arrangement and therefore the basic features here can easily be substituted for improved hardware or firmware arrangements as they are developed.

Storage device 430 is a non-volatile memory and can be a hard disk or other types of computer readable media which can store data that are accessible by a computer, such as magnetic cassettes, flash memory cards, solid state memory devices, digital versatile disks, cartridges, random access memories (RAMs) 425, read only memory (ROM) 420, and hybrids thereof.

The storage device 430 can include software modules 432, 434, 436 for controlling the processor 410. Other hardware or software modules are contemplated. The storage device 430 can be connected to the system bus 405. In one aspect, a hardware module that performs a particular function can include the software component stored in a computer-readable medium in connection with the necessary hardware components, such as the processor 410, bus 405, output device 435 (e.g., a display), and so forth, to carry out the function.

FIG. 4B illustrates a computer system 450 having a chipset architecture that can be used in executing the described method and generating and displaying a graphical user interface (GUI). Computer system 450 is an example of computer hardware, software, and firmware that can be used to implement the disclosed technology. System 450 can include a processor 455, representative of any number of physically and/or logically distinct resources capable of executing software, firmware, and hardware configured to perform identified computations. Processor 455 can communicate with a chipset 460 that can control input to and output from processor 455. In this example, chipset 460 outputs information to output 465, such as a display, and can read and write information to storage device 470, which can include magnetic media, and solid state media, for example. Chipset 460 can also read data from and write data to RAM 475. A bridge 480 for interfacing with a variety of user interface components 485 can be provided for interfacing with chipset 460. Such user interface components 485 can include a keyboard, a microphone, touch detection and processing circuitry, a pointing device, such as a mouse, and so on. In general, inputs to system 450 can come from any of a variety of sources, machine generated and/or human generated.

Chipset 460 can also interface with one or more communication interfaces 590 that can have different physical interfaces. Such communication interfaces can include interfaces for wired and wireless local area networks, for broadband wireless networks, as well as personal area networks. Some applications of the methods for generating, displaying, and using the GUI disclosed herein can include receiving ordered datasets over the physical interface or be generated by the machine itself by processor 455 analyzing data stored in storage 470 or RAM 475. Further, the machine can receive inputs from a user via user interface components 485 and execute appropriate functions, such as browsing functions by interpreting these inputs using processor 455.

It can be appreciated that example systems 400 and 450 can have more than one processor 410 or be part of a group or cluster of computing devices networked together to provide greater processing capability.

For clarity of explanation, in some instances the present technology can be presented as including individual functional blocks including functional blocks comprising devices, device components, steps or routines in a method embodied in software, or combinations of hardware and software.

In some examples, the computer-readable storage devices, mediums, and memories can include a cable or wireless signal containing a bit stream and the like. However, when mentioned, non-transitory computer-readable storage media expressly exclude media such as energy, carrier signals, electromagnetic waves, and signals per se.

Methods according to the above-described examples can be implemented using computer-executable instructions that are stored or otherwise available from computer readable media. Such instructions can comprise, for example, instructions and data which cause or otherwise configure a general purpose computer, special purpose computer, or special purpose processing device to perform a certain function or group of functions. Portions of computer resources used can be accessible over a network. The computer executable instructions can be, for example, binaries, intermediate format instructions such as assembly language, firmware, or source code. Examples of computer-readable media that can be used to store instructions, information used, and/or information created during methods according to described examples include magnetic or optical disks, flash memory, USB devices provided with non-volatile memory, networked storage devices, and so on.

Devices implementing methods according to these disclosures can comprise hardware, firmware and/or software, and can take any of a variety of form factors. Typical examples of such form factors include laptops, smart phones, small form factor personal computers, personal digital assistants, and so on. Functionality described herein also can be embodied in peripherals or add-in cards. Such functionality can also be implemented on a circuit board among different chips or different processes executing in a single device, by way of further example.

The instructions, media for conveying such instructions, computing resources for executing them, and other structures for supporting such computing resources are means for providing the functions described in these disclosures.

Various aspects of the present technology provide methods for intelligently and dynamically calibrating battery capacity of a battery system in a server system. While specific examples have been cited above showing how the optional operation can be employed in different instructions, other examples can incorporate the optional operation into different instructions. For clarity of explanation, in some instances the present technology can be presented as including individual functional blocks including functional blocks comprising devices, device components, steps or routines in a method embodied in software, or combinations of hardware and software.

The various examples can be further implemented in a wide variety of operating environments, which in some cases can include one or more server computers, user computers or computing devices which can be used to operate any of a number of applications. User or client devices can include any of a number of general purpose personal computers, such as desktop or laptop computers running a standard operating system, as well as cellular, wireless and handheld devices running mobile software and capable of supporting a number of networking and messaging protocols. Such a system can also include a number of workstations running any of a variety of commercially-available operating systems and other known applications for purposes such as development and database management. These devices can also include other electronic devices, such as dummy terminals, thin-clients, gaming systems and other devices capable of communicating via a network.

To the extent examples, or portions thereof, are implemented in hardware, the present invention can be implemented with any or a combination of the following technologies: a discrete logic circuit(s) having logic gates for implementing logic functions upon data signals, an application specific integrated circuit (ASIC) having appropriate combinational logic gates, programmable hardware such as a programmable gate array(s) (PGA), a field programmable gate array (FPGA), etc.

Most examples utilize at least one network that would be familiar to those skilled in the art for supporting communications using any of a variety of commercially-available protocols, such as TCP/IP, OSI, FTP, UPnP, NFS, CIFS, AppleTalk etc. The network can be, for example, a local area network, a wide-area network, a virtual private network, the Internet, an intranet, an extranet, a public switched telephone network, an infrared network, a wireless network and any combination thereof.

Methods according to the above-described examples can be implemented using computer-executable instructions that are stored or otherwise available from computer readable media. Such instructions can comprise, for example, instructions and data which cause or otherwise configure a general purpose computer, special purpose computer, or special purpose processing device to perform a certain function or group of functions. Portions of computer resources used can be accessible over a network. The computer executable instructions can be, for example, binaries, intermediate format instructions such as assembly language, firmware, or source code. Examples of computer-readable media that can be used to store instructions, information used, and/or information created during methods according to described examples include magnetic or optical disks, flash memory, USB devices provided with non-volatile memory, networked storage devices, and so on.

Devices implementing methods according to these technology can comprise hardware, firmware and/or software, and can take any of a variety of form factors. Typical examples of such form factors include server computers, laptops, smart phones, small form factor personal computers, personal digital assistants, and so on. Functionality described herein also can be embodied in peripherals or add-in cards. Such functionality can also be implemented on a circuit board among different chips or different processes executing in a single device, by way of further example.

In examples utilizing a Web server, the Web server can run any of a variety of server or mid-tier applications, including HTTP servers, FTP servers, CGI servers, data servers, Java servers and business application servers. The server(s) can also be capable of executing programs or scripts in response requests from user devices, such as by executing one or more Web applications that can be implemented as one or more scripts or programs written in any programming language, such as Java®, C, C# or C++ or any scripting language, such as Perl, Python or TCL, as well as combinations thereof. The server(s) can also include database servers, including without limitation those commercially available from open market.

The server farm can include a variety of data stores and other memory and storage media as discussed above. These can reside in a variety of locations, such as on a storage medium local to (and/or resident in) one or more of the computers or remote from any or all of the computers across the network. In a particular set of examples, the information can reside in a storage-area network (SAN) familiar to those skilled in the art. Similarly, any necessary files for performing the functions attributed to the computers, servers or other network devices can be stored locally and/or remotely, as appropriate. Where a system includes computerized devices, each such device can include hardware elements that can be electrically coupled via a bus, the elements including, for example, at least one central processing unit (CPU), at least one input device (e.g., a mouse, keyboard, controller, touch-sensitive display element or keypad) and at least one output device (e.g., a display device, printer or speaker). Such a system can also include one or more storage devices, such as disk drives, optical storage devices and solid-state storage devices such as random access memory (RAM) or read-only memory (ROM), as well as removable media devices, memory cards, flash cards, etc.

Such devices can also include a computer-readable storage media reader, a communications device (e.g., a modem, a network card (wireless or wired), an infrared computing device) and working memory as described above. The computer-readable storage media reader can be connected with, or configured to receive, a computer-readable storage medium representing remote, local, fixed and/or removable storage devices as well as storage media for temporarily and/or more permanently containing, storing, transmitting and retrieving computer-readable information. The system and various devices also typically will include a number of software applications, modules, services or other elements located within at least one working memory device, including an operating system and application programs such as a client application or Web browser. It should be appreciated that alternate examples can have numerous variations from that described above. For example, customized hardware might also be used and/or particular elements might be implemented in hardware, software (including portable software, such as applets) or both. Further, connection to other computing devices such as network input/output devices can be employed.

Storage media and computer readable media for containing code, or portions of code, can include any appropriate media known or used in the art, including storage media and computing media, such as but not limited to volatile and non-volatile, removable and non-removable media implemented in any method or technology for storage and/or transmission of information such as computer readable instructions, data structures, program modules or other data, including RAM, ROM, EPROM, EEPROM, flash memory or other memory technology, CD-ROM, digital versatile disk (DVD) or other optical storage, magnetic cassettes, magnetic tape, magnetic disk storage or other magnetic storage devices or any other medium which can be used to store the desired information and which can be accessed by a system device. Based on the technology and teachings provided herein, a person of ordinary skill in the art will appreciate other ways and/or methods to implement the various aspects of the present technology.

The specification and drawings are, accordingly, to be regarded in an illustrative rather than a restrictive sense. It will, however, be evident that various modifications and changes can be made thereunto without departing from the broader spirit and scope of the invention as set forth in the claims.

What is claimed is:

1. A server system, comprising:
at least one processor; and
memory including instructions that, when executed by the at least one processor, cause the system to:
monitor a status of a battery system, the status of the battery system including current and past battery cell characteristics of each battery cell of the battery system;
monitor ambient temperature of the battery system using a temperature sensor built into the server system;
determine that a predetermined period of time has lapsed since a full-charge capacity of the battery system was previously updated;
cause the battery system to enter into a static learning mode;
update a database of correlations between a full-charge capacity of a specific type of battery cell and cell characteristics of a corresponding type of battery cell, wherein the database is updated based at least upon the current and past battery cell characteristics, and determined full-charge capacity of each of the corresponding type of battery cells in the battery system, wherein the specific type of battery cell includes at least one of lead-acid, nickel cadmium (NiCd), nickel metal hydride (NiMH), lithium ion (Li-ion), and lithium ion polymer (Li-ion polymer); and determine an updated full-charge capacity of the battery system based at least upon the ambient temperature, and the database.

2. The system of claim 1, wherein the instructions when executed further cause the system to:
in response to a determination that the updated full-charge capacity of the battery system is below a threshold battery capacity, generate a battery-aging-alarm signal.

3. The system of claim 2, wherein the battery-aging-alarm signal includes a status of each battery cell of the battery system or an identification of a specific battery cell that needs to be replaced.

4. The system of claim 1, wherein the battery cell characteristics include cell age, cell temperature, environment temperature, cell resistance, output voltage, and/or charging and discharging cycles.

5. The system of claim 1, wherein the instructions when executed further cause the system to:
in response to an input power to the server system being interrupted, monitor a current flowing out of each battery cell of the battery system during a discharging period;
monitor battery cell characteristics of each battery cell of the battery system during the discharging period;
monitor a current flowing into each battery cell of the battery system during a recharging period;
monitor battery cell characteristics of each battery cell of the battery system during the recharging period; and
update the database of correlations between the full-charge capacity of the specific type of battery cell and the cell characteristics of the corresponding type of battery cell based at least upon the currents flowing out of and into each of the corresponding type of battery cells in the battery system during the discharging and recharging periods, and the battery cell characteristics of the corresponding type of battery cell in the battery system.

6. The system of claim 1, wherein the instructions when executed further cause the system to:
in response to the determination that the predetermined period of time has lapsed since the previous update on the full-charge capacity of the battery system, and receiving a learning mode command, cause the battery system to be switched to a constant current mode.

7. The system of claim 6, wherein the instructions when executed further cause the system to:
discharge the battery system with a constant current for a predetermined percentage of a previously determined full-charge capacity of the battery system;
recharge the battery system to a full-charge capacity; and
determine the updated full-charge capacity of the battery system based at least upon the battery cell characteristics of each battery cell of the battery system during discharging and recharging periods, or the database.

8. The system of claim 1, wherein the instructions when executed further cause the system to:
in response to receiving a battery discharge command, cause the battery system to be switched to a fully discharging-recharging mode.

9. The system of claim 8, wherein the instructions when executed further cause the system to:
fully discharge the battery system;
monitor a current flowing out of the battery system;
recharge the battery system to a full-charge capacity;
monitor a current flowing into the battery system; and
determine the updated full-charge capacity of the battery system based at least upon the currents flowing out of and into the battery system.

10. The system of claim 1, wherein the battery system includes one or more rechargeable battery cells, each of the one or more rechargeable battery cells including at least one chemical selected from a group comprising lead-acid, nickel cadmium (NiCd), nickel metal hydride (NiMH), lithium ion (Li-ion), and lithium ion polymer (Li-ion polymer).

11. A computer-implemented method for enhancing memory fault tolerance in a server system, comprising:
monitoring a status of a battery system, the status of the battery system including current and past battery cell characteristics of each battery cell of the battery system;
monitoring ambient temperature of the battery system using a temperature sensor built into the server system;
determining that a predetermined period of time has lapsed since a full-charge capacity of the battery system was previously updated;
causing the battery system to enter into a static learning mode;
updating a database of correlations between a full-charge capacity of a specific type of battery cell and cell characteristics of a corresponding type of battery cell, wherein the database is updated based at least upon the current and past battery cell characteristics, and determined full-charge capacity of each of the corresponding type of battery cells in the battery system, wherein the specific type of battery cell includes at least one of lead-acid, nickel cadmium (NiCd), nickel metal hydride (NiMH), lithium ion (Li-ion), and lithium ion polymer (Li-ion polymer); and
determining an updated full-charge capacity of the battery system based at least upon the ambient temperature, and the database.

12. The computer-implemented method of claim 11, further comprising:
in response to a determination that the updated full-charge capacity of the battery system is below a threshold battery capacity, generating a battery-aging-alarm signal.

13. The computer-implemented method of claim 12, further comprising:
generating an update status of each battery cell of the battery system;
or
identifying a specific battery cell that needs to be replaced.

14. The computer-implemented method of claim 11, further comprising:
in response to an input power to the server system being interrupted, monitoring a current flowing out of each battery cell of the battery system during a discharging period;
monitoring battery cell characteristics of each battery cell of the battery system during the discharging period;
monitoring a current flowing into each battery cell of the battery system during a recharging period;
monitoring battery cell characteristics of each battery cell of the battery system during the recharging period; and updating the database of correlations between the full-charge capacity of the specific type of battery cell and the cell characteristics of the corresponding type of battery cell based at least upon the currents flowing out of and into each of the corresponding type of battery cells in the battery system during the discharging and recharging periods, and the battery cell characteristics of the corresponding type of battery cell in the battery system.

15. The computer-implemented method of claim 11, further comprising: in response to the determination that the predetermined period of time has lapsed since the previous update on the full-charge capacity of the battery system, and receiving a learning mode command, causing the battery system to be switched to a constant current mod.

16. The computer-implemented method of claim 15, further comprising:
discharging the battery system with a constant current for a predetermined percentage of a previously determined full-charge capacity of the battery system;
recharging the battery system to a full-charge capacity; and
determining the updated full-charge capacity of the battery system based at least upon the battery cell characteristics of each battery cell of the battery system during discharging and recharging periods, or the database.

17. A non-transitory computer-readable storage medium including instructions that, when executed by at least one processor of a server system, cause the server system to:
monitor a status and ambient temperature of a battery system, the status of the battery system including current and past battery cell characteristics of each battery cell of the battery system;
monitor ambient temperature of the battery system using a temperature sensor built into the server system;
determine that a predetermined period of time has lapsed since a full-charge capacity of the battery system was previously updated;
cause the battery system to enter into a static learning mode;
update a database of correlations between a full-charge capacity of a specific type of battery cell and cell characteristics of a corresponding type of battery cell, wherein the database is updated based at least upon the current and past battery cell characteristics, and determined full-charge capacity of each of the corresponding type of battery cells in the battery system, wherein the specific type of battery cell includes at least one of lead-acid, nickel cadmium (NiCd), nickel metal hydride (NiMH), lithium ion (Li-ion), and lithium ion polymer (Li-ion polymer); and
determine an updated full-charge capacity of the battery system based at least upon the ambient temperature, and the database.

18. The non-transitory computer-readable storage medium of claim 17, wherein the instructions when executed further cause the system to:
in response to an input power to the server system being interrupted, monitor a current flowing out of each battery cell of the battery system during a discharging period;
monitor battery cell characteristics of each battery cell of the battery system during the discharging period;
monitor a current flowing into each battery cell of the battery system during a recharging period;
monitor battery cell characteristics of each battery cell of the battery system during the recharging period; and
update the database of correlations between the full-charge capacity of the specific type of battery cell and the cell characteristics of the corresponding type of battery cell based at least upon the currents flowing out of and into each of the corresponding type of battery cells in the battery system during the discharging and recharging periods, and the battery cell characteristics of the corresponding type of battery cell in the battery system.

19. The non-transitory computer-readable storage medium of claim 17, wherein the instructions when executed further cause the system to: in response to receiving a battery discharge command, cause the battery system to be switched to a fully discharging-recharging mode.

20. The non-transitory computer-readable storage medium of claim 19, wherein the instructions when executed further cause the system to:
fully discharge the battery system;
monitor currents flowing out of the battery system;
recharge the battery system to a full-charge capacity;
monitor currents flowing into the battery system; and
determine the updated full-charge capacity of the battery system based at least upon the currents flowing out of and into the battery system.

* * * * *